United States Patent [19]
Hirakawa

[11] Patent Number: 5,093,711
[45] Date of Patent: Mar. 3, 1992

[54] SEMICONDUCTOR DEVICE
[75] Inventor: Kazuki Hirakawa, Suwa, Japan
[73] Assignee: Seiko Epson Corporation, Tokyo, Japan
[21] Appl. No.: 419,657
[22] Filed: Oct. 11, 1989
[30] Foreign Application Priority Data Oct. 14, 1988 [JP] Japan .................... 63-258833
May 16, 1989 [JP] Japan .................... 1-122525
May 16, 1989 [JP] Japan .................... 1-122526
Jul. 6, 1989 [JP] Japan .................... 1-175167

[51] Int. Cl.⁵ .............................. H01L 23/48
[52] U.S. Cl. ............................. 357/71; 357/59
[58] Field of Search ..................... 357/71, 59

[56] References Cited
U.S. PATENT DOCUMENTS

| | | | |
|---|---|---|---|
| 3,881,242 | 6/1975 | Nutall .................... | 357/59 |
| 4,302,763 | 11/1981 | Ohuchi et al. ............ | 357/63 |
| 4,424,579 | 1/1984 | Roesner ................... | 365/105 |
| 4,431,460 | 2/1984 | Barson et al. ............ | 357/91 |
| 4,442,507 | 4/1984 | Roesner ................... | 365/100 |
| 4,583,106 | 4/1986 | Anantha et al. ........... | 357/35 |
| 4,590,589 | 5/1986 | Gerzberg .................. | 365/100 |
| 4,598,386 | 7/1986 | Roesner et al. ........... | 365/105 |
| 4,823,181 | 4/1989 | Mohsen et al. ............ | 357/51 |
| 4,881,113 | 11/1989 | Momodomi ................. | 357/71 |

OTHER PUBLICATIONS

Yosi Shacham-Diamon et al., A Novel Ion-Implanted Amorphous Silicon Programmable Element, IEDM 87, pp. 194-197.
Esmat Handy et al., Dielectric Based Antifuse for Logic and Memory ICs. IEDM 88, pp. 786-789.

Primary Examiner—Eugene R. Laroche
Assistant Examiner—R. Ratliff
Attorney, Agent, or Firm—Spensley Horn Jubas & Lubitz

[57] ABSTRACT

A semiconductor device used as an electrically programmable read-only memory. The resistance of the device is irreversibly varied from a high value to a low value by applying an electric field. The device is composed of a silicon semiconductor substrate of a first conductivity type, a diffused layer of a second conductivity type opposite to the first conductivity type, an interlayer insulating film formed on the diffused layer, an amorphous silicon layer containing impurity of the first conductivity type, and a metal film forming conductive interconnections. The diffused layer acts as a lower electrode. The metal film serves as an upper electrode. The amorphous silicon layer and the metal film are stacked on the diffused layer.

21 Claims, 3 Drawing Sheets

SEMICONDUCTOR DEVICE

BACKGROUND OF THE INVENTION

1. Field of the Invention.

The present invention relates to a semiconductor device whose resistance is varied from a high resistance value to a low resistance value irreversibly by applying an electric field and, more particularly, to a semiconductor device having electrically programmable read-only memories.

2. Prior Art.

A so-called antifuse device having amorphous silicon layers inserted between successive electrodes has been used as a semiconductor device whose resistance is varied from a high value to a low value irreversibly by applying an electric field. Especially, where antifuse devices are used in an electrically programmable read-only memory, it has been the common practice to add a diode to each individual storage element thereby making the ROM circuit configuration simpler. Such a diode is created by forming a Schottky junction layer on a lightly doped N-type semiconductor layer, the junction layer including platinum.

Figure 2:
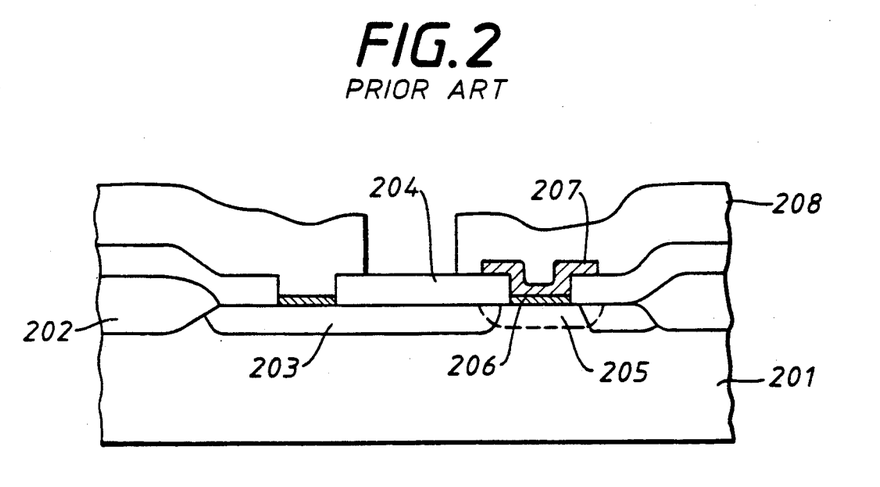
FIG. 2 is a cross-sectional view of main portions of a known semiconductor device.

A known semiconductor device is shown in FIG. 2, where a diffused layer formed in a silicon substrate is used as one electrode of a storage element. The silicon substrate, indicated by 201, is of the P type. Created over the substrate 201 are a selectively oxidized film 202 forming a field-insulated, or device isolating, film, an N+-type diffused layer 203, an interlayer insulating film 204, an N--type diffused layer 205, a platinum silicide layer 206, an amorphous silicon film 207, and a conductive film 208 for forming metal interconnections. The insulating film 204 is made from silicon oxide, for example.

In this device, the N--type diffused layer 205 is in contact with the N+-type diffused layer 203. The platinum silicide layer 206, the amorphous silicon film 207, and the film 208 for forming metal interconnections are laminated on the diffused layer 205 which serves as a lower electrode. The film 208 acts as an upper electrode. In operation, an electric field is applied between the upper and lower electrodes to cause avalanche breakdown in the amorphous silicon film 207. At this time, Joule heat is evolved to change parts of the amorphous silicon film 207, thus forming low-resistance regions. The rectifying function of the Schottky diode between the platinum silicide layer 206 and the N--type diffused layer 205 is combined with the low-resistance regions of the amorphous silicon film 207 to provide the known, electrically programmable read-only memory.

Another known semiconductor device is disclosed in U.S. Pat. No. 4,442,507. This device has a polycrystalline silicon layer which is formed on a silicon substrate and acts as one electrode of each storage element. In particular, the polycrystalline silicon layer is heavily doped so as to exhibit N-type conductivity. Another polycrystalline silicon layer formed on the heavily doped silicon layer is lightly doped and of the N-type conductivity. A platinum silicide layer, an amorphous silicon film, and a film for forming metal interconnections are deposited on the lightly doped polycrystalline silicon layer. The film forming the metal interconnections forms upper electrodes. Schottky diodes that are created between the platinum silicide layer and the lightly doped N-type polycrystalline silicon layer are employed.

In this known device, the lightly doped N-type diffused layer is formed to create the Schottky junctions. This presents the following problems.

(1) The resistance obtained after programming the device increases by an amount equal to the resistance of the lightly doped N-type diffused layer (examples 1 and 2).

(2) Where programmable elements are formed in series on the same lower electrode, the resistance of the lower electrode further increases by an amount equal to the resistance of the lightly doped N-type diffused layer (example 1).

(3) The resistance of the thin N-type diffused layer is easily modulated with voltage and so the resistance values of the programmed device easily vary during operation (example 1).

(4) When the thin N-type diffused layer is formed to create the Schottky junctions, it is necessary to take account of allowance for alignment. This increases the area of patterning (example 1).

SUMMARY OF THE INVENTION

Accordingly, it is an object of the invention to provide a semiconductor device which has low and stable resistance values after having been programmed and has a small patterned region, and in which, when an electric field is applied, the resistance irreversibly varies from a high resistance value to a low resistance value and then the device exhibits rectification.

The above object and other objects are achieved in accordance with the invention by a semiconductor device comprising: a first semiconductor layer of a first conductivity type; a second semiconductor layer containing impurity between lattice sites, the impurity having a second conductivity type different from the first conductivity type; and an upper electrode layer.

In this configuration, the first semiconductor layer is of the N type, for example. The second semiconductor layer formed on the N-type semiconductor layer is an amorphous semiconductor film, a polycrystalline semiconductor film, or a semiconductor film whose crystal has been destroyed by ion implantation or other technique, the second layer film being lightly doped with P-type impurity. Before the device is programmed, P-type inactivated impurity exists between lattice sites in the noncrystalline or polycrystalline semiconductor film. In this state, the film is electrically inactive and, therefore, it shows a high resistance irrespective of the direction of the applied electric field. Once a high electric field is applied to the second layer film deposited on the N-type first semiconductor layer as a lower electrode, an avalanche breakdown takes place, producing excessive electric current. This gives rise to Joule heating, which partially changes the crystalline structure of the programmed film that is lightly doped and contains P-type impurity. Also, the P-type impurity is activated. As a result, the deposited film which showed a high resistance acts as a diode that exhibits a low resistance in the forward direction.

Other objects and features of the invention will appear in the course of the description thereof which follows.

DETAILED DESCRIPTION OF THE INVENTION

Figure 1:
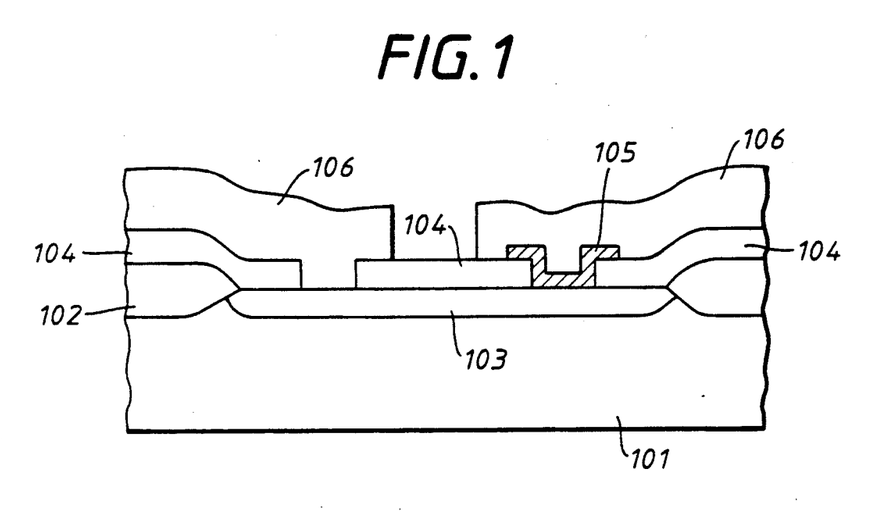
FIG. 1 is a cross-sectional view of the main portions of a semiconductor device according to the invention.

Referring to FIG. 1, there is shown a semiconductor device embodying the concept of the invention. This device comprises a P-type semiconductor substrate 101 consisting of silicon or other material, a selectively oxidized film 102 forming a field-insulated film and consisting of silicon oxide, for example, an N+-type diffused layer 103, an interlayer insulating film 104 consisting of silicon oxide for example, an amorphous silicon film 105 containing a P-type impurity, and a film 106 forming metal interconnections. The film 106 consists of one or more layers formed from Al, or a metal having a high melting point such as Mo, Ti, W, or a silicide of such a high-melting point metal. The amorphous silicon film 105 having the P-type impurity and the upper electrode consisting of the film 106 are formed over the N+-type diffused layer 103 that forms the lower electrode. By programming such a programmable element, which initially has a high resistance, it exhibits rectification as described previously.

This semiconductor device is fabricated in the manner described below. First, the selectively oxidized film 102 is formed on the P-type semiconductor substrate 101. Then, ions of phosphorus at a dose of $4 \times 10^{15}$ cm$^{-2}$ are injected into the silicon substrate 101 at 60 KeV by the ion implanting technique to form the N+-type diffused layer 103 which becomes the lower electrode of the programmable element. Subsequently, a film of silicon oxide is deposited by the CVD process to form the interlayer insulating film 104. Openings necessary for direct connection with the N+-type diffused layer 103 are made. Also, openings required to make connection via the amorphous silicon film 105 containing the P-type impurity and constituting the main portions of the programmable elements are formed. Thereafter, SiH$_4$ is decomposed by the CVD process at a low temperature of 560° C. to deposit an amorphous silicon film up to a thickness of 1500 Å. Boron fluoride at a dose of $1 \times 10^{11}$ to $1 \times 10^{15}$ cm$^{-2}$ is introduced into the amorphous silicon film at 60 KeV by ion implantation to subsequently obtain desired diode characteristics. Thus, the amorphous silicon film 105 containing the P-type impurity is formed. This amorphous film 105 is then photolithographically patterned to have the desired outline. Then, a barrier metal and aluminum are sputtered to form a laminate, which is then photolithographically patterned to create the film 106 for forming conductive interconnections. The resistance of this device can be irreversibly changed from a high value to a low value by the application of an electric field, whereupon the device exhibits rectification. The selectively oxidized film 102 is formed by localized oxidation of silicon (LOCOS). It is also possible to form grooves in a semiconductor substrate and to insert an insulator in the grooves. The aforementioned barrier metal can be a metal having a high melting point such as Mo, Ti, W, or a silicide or nitride of such a metal. Usually, the barrier metal is located under aluminum.

The electrical characteristics of the semiconductor device are next described, for an example in which ions of boron fluoride at a dose of $1 \times 10^{15}$ cm$^{-2}$ are injected at 60 KeV into an amorphous silicon film containing P-type impurity and the openings required to make connections via the amorphous silicon film each have a diameter of 1.2 μm.

Figure 3A:
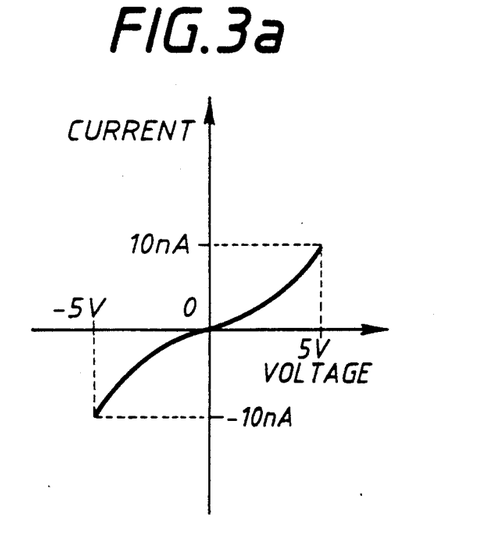
FIG. 3(a) is a graph showing the electrical characteristic of a semiconductor device according to the invention which is not yet programmed.
Figure 3B:
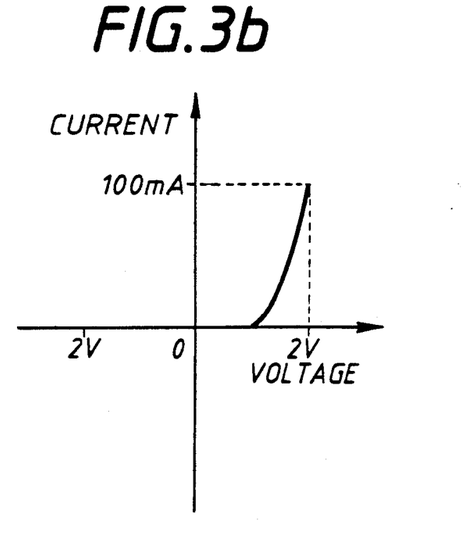
FIG. 3(b) is a graph similar to FIG. 3(a), but in which the device has been programmed.

FIG. 3(a) shows the electrical characteristic of the device before it is programmed. FIG. 3(b) shows the electrical characteristic of the device after it has been programmed by applying an electric field to induce an avalanche breakdown and producing an electric current of 2 to 3 mA. Before the device is programmed, the electrical characteristic curve is substantially symmetrical with respect to the zero voltage value. Electric current of only 10 nA flows at 5 V and so the resistance is high. After a voltage is applied to program the device, if a positive operating voltage is applied to the upper electrode, which is an aluminum film overlying the amorphous silicon film, a forward characteristic is exhibited. If a negative operating voltage is applied, a reverse characteristic is obtained. In the case of an undoped amorphous silicon film, after the device is programmed, the characteristic curve is still substantially symmetrical with respect to the zero voltage value, and the resistance is low. These changes in the electrical characteristic are considered as being brought about by the mechanism described above. That is, the structure of the amorphous silicon film is partially changed by Joule heat produced by the electric programming current. The P-type impurity is activated. PN junction diodes are created between the amorphous silicon film and the N+-type diffused layer that acts as the lower electrode.

Figure 4:
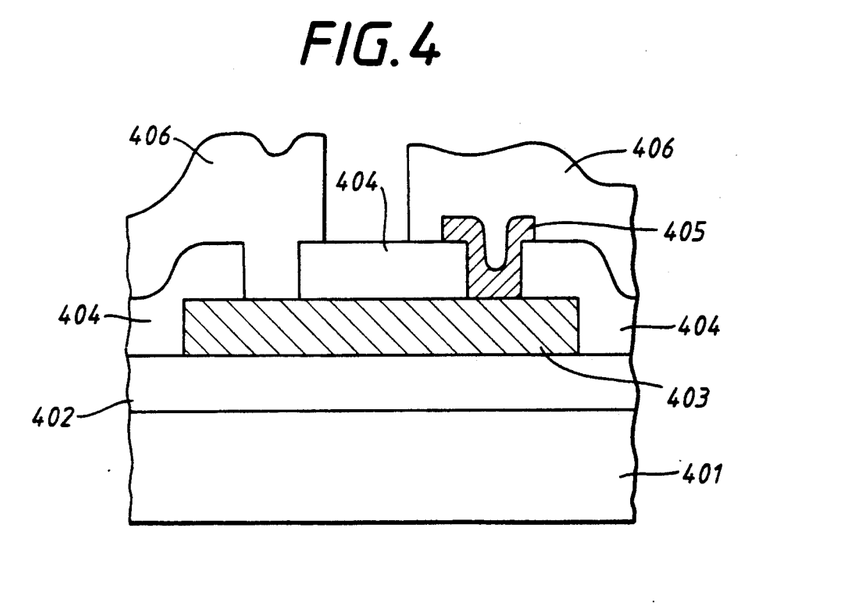
FIG. 4 is a cross-sectional view of main portions of another semiconductor device according to the invention.

Referring next to FIG. 4, there is shown another semiconductor device according to the invention. This device is similar to the device shown in FIG. 1 except that the N+-type diffused layer acting as the lower electrode and shown in FIG. 1 is replaced by an N+-type polycrystalline silicon film on an oxide film. The device shown in FIG. 4 comprises a P-type semiconductor substrate 401, a selectively oxidized film 402, an N+-type polycrystalline silicon film 403, an interlayer insulating film 404, an amorphous silicon film 405 containing P-type impurity, and a film 406 forming metal interconnections. The film 406 consists of two layers, i.e., a barrier metal layer and an aluminum layer formed on it, in the same way as in the device already described in connection with FIG. 1. The use of the N+-type polycrystalline silicon film 403 on the oxide film 402 increases the degree of freedom with which the pattern may be laid out. Further, the N+-type polycrystalline silicon 403 acting as the lower electrode is surrounded by the insulating film 404 consisting of silicon oxide. Therefore, the Joule heat generated during programming does not readily dissipate and the device can be programmed with lower electric current.

Figure 5:
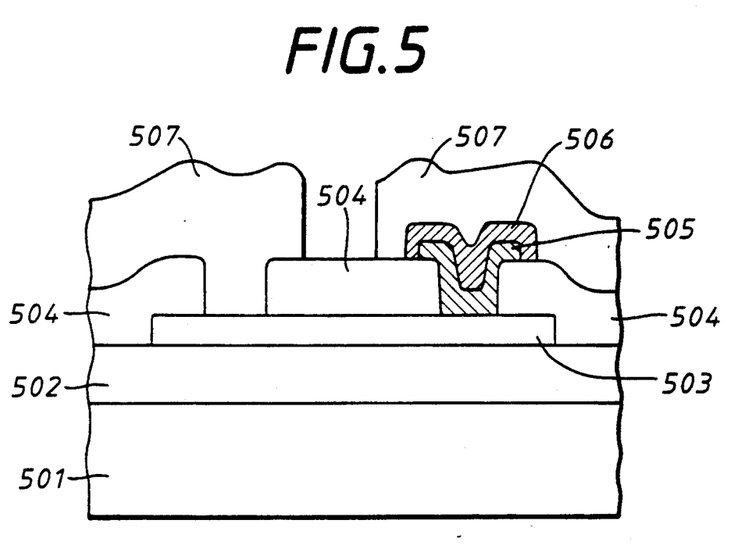
FIG. 5 is a cross-sectional view of main portions of a further semiconductor device according to the invention.

Referring to FIG. 5, there is shown a further semiconductor device according to the invention. This device comprises a P-type semiconductor substrate 501, an insulating film 502 consisting of a selectively oxidized film, a low-resistance film 503, an interlayer insulating film 504, an N+-type polycrystalline silicon film 505, an amorphous silicon film 506 containing P-type impurity, and a film 507 forming metal interconnections. The low-resistance film 503 which acts as a lower electrode is made from a metal having a low resistance, such as Mo, Ti, or W, or silicide of such a metal, such as $MoSi_2$. Holes are formed in the interlay insulating film 504 to receive film 505 and a metal interconnection.

This device is fabricated in the following manner. The substrate 501 is made from silicon. Silicon oxide is deposited on the substrate 501 to form the insulating film 502. Then, $MoSi_2$ is sputtered on the insulating film 502 up to a thickness of 0.2 $\mu$m and photolithographically patterned to form the metal film 503 that serves as the lower electrodes of programmable elements. A silicon oxide film is deposited by the CVD process to form the interlayer insulating film 504. Holes are formed through the insulating film 504 at locations at which N-type polycrystalline silicon film 505 and the amorphous silicon film 506 containing the P-type impurity are to be deposited. Subsequently, N-type polycrystalline silicon is deposited up to a thickness of 0.2 $\mu$m. The polycrystalline silicon film 505 is etched into the desired pattern. Ions of phosphorus at a dose of $4 \times 10^{15}$ cm$^{-2}$ are injected into the polycrystalline silicon at 60 KeV by ion implantation, and then the laminate is annealed in an electric furnace to activate the impurities thus forming the N-type polycrystalline silicon film 505. Then, $SiH_4$ is decomposed at a low temperature of 560° C. by the CVD process to deposit amorphous silicon as a layer up to a thickness of 1500 Å. Ions of boron fluoride at a dose of $1 \times 10^{11}$ to $1 \times 10^{15}$ cm$^{-2}$ are implanted at 80 KeV to obtain desired diode characteristics. Thus, the amorphous silicon film 506 containing P-type impurity is formed. Then, the doped amorphous silicon film 506 is etched into the desired pattern covering the N-type polycrystalline silicon film 505. Holes are formed in the insulating film 504 at locations at which direct connection of a metal interconnection film with the metal film 503 forming the lower electrodes are made. Subsequently, a barrier metal and aluminum are successively sputtered to form the film 507 for forming the metal interconnections. Finally, this film 507 is patterned by photographic techniques. As a result, a read-only memory is created which can be programmed by dielectric breakdown.

In the present example, chemical vapor deposition (CVD) and ion implantation are employed to fabricate the P-type semiconductor film 506. Instead, sputtering can be used. During chemical vapor deposition or sputtering, dopant may be added. The P-type semiconductor film 506 can be P-type polycrystalline silicon. Also, it can be polycrystalline silicon or crystalline silicon whose crystal has been destroyed by ion implantation or other technique. The P-type semiconductor film 506 can be replaced with an N-type semiconductor film when the lower electrode 503 is a P+-type diffused layer. In the above example, the metal film 503 forming the lower electrode is made from $MoSi_2$. Also, the metal film can be fabricated from $TiSi_2$ or $WSi_2$. Further, the metal film can be polycide. In the present example, the semiconductor substrate 501 can be either P-type silicon or N-type silicon.

Figure 6:
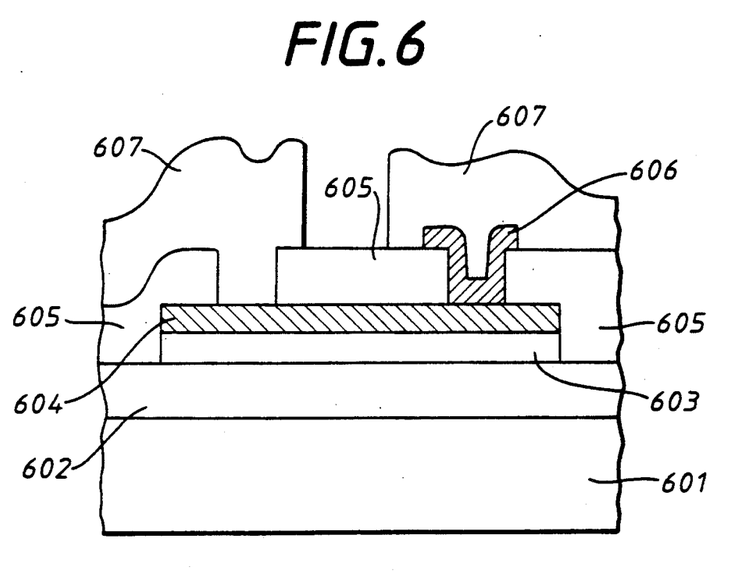
FIG. 6 is a cross-sectional view of main portions of still another semiconductor device according to the invention.

Referring next to FIG. 6, there is shown still another semiconductor device according to the invention. This device comprises a P-type semiconductor substrate 601, an insulating film 602 that is a selectively oxidized film, a low-resistance film 603 made from a low-resistance metal or metal silicide, such as $MoSi_2$, an N+-type polycrystalline silicon film 604 formed on the low-resistance film 603, an interlayer insulating film 605, an amorphous silicon film 606 containing P-type impurity, and a film 607 forming metal interconnections. The low-resistance film 603 acts as a lower electrode.

This semiconductor device is manufactured in the manner described below. First, the insulating film 602 consisting of a film of silicon oxide is formed on the semiconductor substrate 601 made from silicon. Then, $MoSi_2$ is sputtered on the laminate up to a thickness of 0.2 $\mu$m to form the metal film 603 which creates the lower electrodes of programmable elements. Then, polycrystalline silicon is deposited on the laminate to a thickness of 0.2 $\mu$m. Subsequently, ions of phosphorous at a dose of $4 \times 10^{15}$ cm$^{-2}$ are implanted at 60 KeV, followed by annealing of the laminate inside an electric furnace to form the N-type polycrystalline silicon film 604. The metal film 603 and the N-type polycrystalline silicon film 604 are etched into a desired pattern by photoetching techniques. Then, silicon oxide is deposited as a film by chemical vapor deposition to form the interlayer insulating film 605. Holes extending through the insulating film are formed at locations at which the amorphous silicon film 606 containing P-type impurity is formed. Then, $SiH_4$ is decomposed at a low temperature of 560° C. by the CVD process to form the amorphous silicon layer of 1500 Å thick. Ions of boron fluoride of $1 \times 10^{11}$ to $1 \times 10^{15}$ cm$^{-2}$ are implanted at 80 KeV to derive desired diode characteristics. Thus, the amorphous silicon film 606 containing P-type impurity is formed and is then etched into a desired pattern. Holes are formed at locations at which direct connection with the N-type polysilicon film 604 forming a part of the lower electrode is made. A barrier metal and aluminum are successively sputtered as films to form the film 607 creating metal interconnections. Finally, the laminate 607 is etched into a desired pattern. In this way, a read-only memory which can be programmed by dielectric breakdown is offered.

In this example, the CVD process and ion implantation are employed to fabricate the P-type semiconductor film. These methods can be replaced by sputtering. During chemical vapor deposition or sputtering, impurity may be added. The P-type semiconductor film can be a P-type polycrystalline silicon. Further, it can be polycrystalline silicon or crystalline silicon whose crystal structure has been destroyed by ion implantation. The P-type semiconductor film can be replaced by an N-type semiconductor film where the lower electrode is a P+-type diffused layer. In the above example, the metal film forming the lower electrode is made from $MoSi_2$. It is also possible to fabricate the metal film from $TiSi_2$ or $WSi_2$. Additionally, it can be polycide. Furthermore, the semiconductor substrate can be either P-type silicon or N-type silicon.

In the examples shown in FIGS. 5 and 6, the lower electrodes 503, 603 are made from a metal such as Mo, Ti, or W, or silicide of such a metal. This lowers the resistance of the lower electrodes. Therefore, where programmed regions are arranged in series, they can be programmed with lower electric current.

In the aforementioned four examples, the semiconductor films having P-type impurity between lattices are formed by chemical vapor deposition and ion implantation. These films can also be created by sputtering. The semiconductor films may be made from polycrystalline silicon into which ions of P-type impurity are injected. Also, they may be polycrystalline silicon or crystalline silicon whose crystal structure has been destroyed by ion implantation. In the above examples, the P-type semiconductor film has impurity between lattices. Where the lower electrode is a $P^+$-type diffused layer, the film contacting the lower electrode may be a semiconductor film containing N-type impurity between lattices. In the examples shown in FIGS. 5 and 6, the metal films forming the lower electrodes are made from $MoSi_2$. These films may also be made from $TiSi_2$, $WSi_2$, W or Mo. In the above-described four examples, the films 106, 406, 507, and 607 which create metal interconnections to form upper electrodes may be one or more layers of aluminum, or a high-melting point metal such as W, Ti, Mo, or a silicide thereof. As described thus far, the present invention is not limited to the aforementioned four examples, but various changes and modifications may be made without departing from the spirit and scope of the invention.

As described thus far, the inventive semiconductor device comprises: a first semiconductor layer having a first conductivity type; a second semiconductor layer which is formed on the first semiconductor layer and contains impurity between lattices, the impurity having a second conductivity type different from the first conductivity type; and an upper electrode layer. The resistance of the first semiconductor film that is located just under a programmable film and has the first conductivity type is low. Also, it is not modulated with voltage. Since the structure is simple, the area of the patterned regions is small. In addition, the device is fabricated by simple processes. By forming the lower electrode over the substrate, the generated Joule heat is effectively utilized and so the device can be programmed with lower electric current. The resistance of the lower electrode is lowered by forming the lower electrode from a highmelting point metal such as Mo, Ti, or W, or a silicide of such a metal, such as $MoSi_2$, $TiSi_2$, or $WSi_2$. Hence, a read-only memory capable of operating at a high speed can be obtained.

This application relates to subject matter disclosed in Japanese Patent Applications No. 258833/88 filed Oct. 14, 1989, No. 122525/89 filed May 16, 1989, and No. 122526/89 filed May 16, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
a first layer of semiconductor material having a first conductivity type;
a second layer of semiconductor material constituting a resistant-state transition layer which is formed on the first layer and contains inactivated dopant impurities between lattice sites, the impurities having a second conductivity type different from the first conductivity type; and
an upper electrode layer overlying and conductively connected to the second layer,
wherein said resistance-state transition layer is of a composition which undergoes a transition, upon exposure to electrical current from a voltage applied between said first semiconductor layer and upper electrode, from a high resistance state to a low resistance state, whereupon the first and second layers constitute a diode.

2. The semiconductor device of claim 1 wherein said upper electrode layer is formed of a metal or metal compound.

3. The semiconductor device of claim 1 wherein said upper electrode layer is formed of one or more layers, each layer consisting of Al, Mo, Ti, W, or a silicide of Mo, Ti, or W.

4. The semiconductor device of claim 1, wherein said first layer having the first conductivity type is a diffused layer, and wherein said second semiconductor layer containing impurities between lattice sites is made from polycrystalline silicon, amorphous silicon, or silicon having destroyed crystal structure.

5. The semiconductor device of claim 4 wherein said upper electrode layer is formed of a metal or metal compound.

6. The semiconductor device of claim 4 wherein said upper electrode layer is formed of one or more layers, each layer consisting of Al, Mo, Ti, W, or a silicide of Mo, Ti, or W.

7. The semiconductor device of claim 1, wherein said first semiconductor layer is a doped layer of polycrystalline silicon, and said second semiconductor layer is made from polycrystalline silicon, amorphous silicon, or silicon having destroyed crystal structure.

8. The semiconductor device of claim 7 wherein said upper electrode layer is formed of a metal or metal compound.

9. The semiconductor device of claim 7 wherein said upper electrode layer is formed of one or more layers, each layer consisting of Al, Mo, Ti, W, or a silicide of Mo, Ti, or W.

10. The semiconductor device of claim 1, further comprising a third layer of a metal or metal compound underlying said first layer, and an insulating layer disposed on said third layer and provided with at least one through hole, and where said first layer of the first conductivity type is made from doped polycrystalline silicon and is connected with said third layer via said hole and said second semiconductor layer formed on the first semiconductor layer is made from polycrystalline silicon, amorphous silicon, or silicon having destroyed crystal structure.

11. The semiconductor device of claim 10 wherein said upper electrode layer is formed of a metal or metal compound.

12. The semiconductor device of claim 10 wherein said upper electrode layer is formed of one or more layers, each layer consisting of Al, Mo, Ti, W, or a silicide of Mo, Ti, or W.

13. The semiconductor device of claim 12 wherein said third layer is formed of one or more layers, each layer consisting of Mo, Ti, W, or a silicide of Mo, Ti, or W.

14. The semiconductor device of claim 11 wherein said third layer is formed of one or more layers, each layer consisting of Mo, Ti, W, or a silicide of Mo, Ti, or W.

15. The semiconductor device of claim 10 wherein said third layer is formed of one or more layers, each layer consisting of Mo, Ti, W, or a silicide of Mo, Ti, or W.

16. The semiconductor device of claim 1, further comprising a third layer of a metal or metal compound underlying said first layer, and an insulating layer disposed on said first layer and provided with at least one through hole, and wherein said first layer of the first conductivity type is a doped polycrystalline silicon layer formed on said third layer metal and said second semiconductor layer containing compound impurities between lattices is connected with the first semiconductor layer via said hole and is made from polycrystalline silicon, amorphous silicon, or silicon having destroyed crystal structure.

17. The semiconductor device of claim 16 wherein said upper electrode layer is formed of a metal or metal compound.

18. The semiconductor device of claim 16 wherein said upper electrode layer is formed of one or more layers, each layer consisting of Al, Mo, Ti, W, or a silicide of Mo, Ti, or W.

19. The semiconductor device of claim 18 wherein said third layer is formed of one or more layers, each layer consisting of Mo, Ti, W, or a silicide of Mo, Ti, or W.

20. The semiconductor device of claim 17 wherein said third layer is formed of one or more layers, each layer consisting of Mo, Ti, W, or a silicide of Mo, Ti, or W.

21. The semiconductor device of claim 16 wherein said third layer is formed of one or more layers, each layer consisting of Mo, Ti, W, or a silicide of Mo, Ti, or W.

* * * * *

UNITED STATES PATENT AND TRADEMARK OFFICE
CERTIFICATE OF CORRECTION

PATENT NO. : 5,093,711
DATED : March 3, 1992
INVENTOR(S) : Kazuki Hirakawa

Page 1 of 2

It is certified that error appears in the above-indentified patent and that said Letters Patent is hereby corrected as shown below:

The drawing sheet, consisting of figure 3b, should be deleted to appear as per attached sheet.

Signed and Sealed this

Ninth Day of May, 1995

BRUCE LEHMAN

Attest:

Attesting Officer

Commissioner of Patents and Trademarks

FIG.3b